(12) United States Patent
Huang

(10) Patent No.: US 10,204,582 B2
(45) Date of Patent: Feb. 12, 2019

(54) SHIFT REGISTER AND DRIVING METHOD THEREOF, GATE ELECTRODE DRIVING CIRCUIT, AND DISPLAY DEVICE

(71) Applicants: BOE TECHNOLOGY GROUP CO., LTD., Beijing (CN); Ordos Yuansheng Optoelectronics Co., Ltd., Ordos, Inner Mongolia (CN)

(72) Inventor: Fei Huang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 245 days.

(21) Appl. No.: 15/205,239

(22) Filed: Jul. 8, 2016

(65) Prior Publication Data
US 2017/0193946 A1   Jul. 6, 2017

(30) Foreign Application Priority Data
Jan. 5, 2016   (CN) .......................... 2016 1 0006922

(51) Int. Cl.
*G11C 19/00*   (2006.01)
*G09G 3/36*   (2006.01)
*G11C 19/28*   (2006.01)

(52) U.S. Cl.
CPC .......... *G09G 3/3677* (2013.01); *G11C 19/28* (2013.01); *G09G 2310/0283* (2013.01);
(Continued)

(58) Field of Classification Search
None
See application file for complete search history.

(56) References Cited

U.S. PATENT DOCUMENTS 5,497,114 A * 3/1996 Shimozono .......... H03K 3/0372
   327/202
6,879,313 B1 * 4/2005 Kubota ................ G09G 3/3688
   345/100
(Continued)

FOREIGN PATENT DOCUMENTS

CN   104269145   *   1/2015
CN   104361853   *   2/2015
(Continued)

OTHER PUBLICATIONS

Office Action dated Aug. 14, 2017 issued in corresponding Chinese Application No. 201610006922.2.

*Primary Examiner* — Tuan T Lam
(74) *Attorney, Agent, or Firm* — Nath, Goldberg & Meyer; Joshua B. Goldberg; Daniel Bissing

(57) ABSTRACT

A shift register comprises an input unit, an output unit, a scan direction selecting unit and a data latching unit. The scan direction selecting unit is connected to a forward-scan signal input terminal, a backward-scan signal input terminal, a positive input terminal, an inverse input terminal and the data latching unit. The input unit is connected to a first clock signal input terminal, the forward-scan signal input terminal, the backward-scan signal input terminal, a low-level signal input terminal and the data latching unit. The data latching unit is connected to a reset signal input terminal, the input unit, the output unit, the scan direction selecting unit, and a high-level signal input terminal. The output unit is connected to a second clock signal input terminal, the data latching unit, the low-level signal input terminal, the high-level signal input terminal, the reset signal input terminal, and a signal output terminal.

13 Claims, 2 Drawing Sheets

(52) U.S. Cl.
CPC ............... *G09G 2310/0286* (2013.01); *G09G 2310/0291* (2013.01); *G09G 2310/08* (2013.01); *G09G 2330/021* (2013.01)

(56) References Cited

U.S. PATENT DOCUMENTS

| | | | |
|---|---|---|---|
| 8,466,727 B2* | 6/2013 | Bancel | G06F 21/75 |
| | | | 327/144 |
| 9,177,502 B2 | 11/2015 | Jang et al. | |
| 2012/0287701 A1* | 11/2012 | Takemura | G11C 11/412 |
| | | | 365/149 |
| 2016/0247477 A1* | 8/2016 | Hu | G09G 3/36 |
| 2016/0365050 A1* | 12/2016 | Qing | G09G 3/3677 |
| 2016/0378242 A1* | 12/2016 | Huang | G06F 3/0416 |
| | | | 345/173 |
| 2017/0039973 A1* | 2/2017 | Huang | G09G 3/36 |
| 2017/0084238 A1* | 3/2017 | Cao | G09G 3/3266 |

FOREIGN PATENT DOCUMENTS

| | | |
|---|---|---|
| CN | 104361875 A | 2/2015 |
| CN | 104392686 A | 3/2015 |
| CN | 104992662 A | 10/2015 |
| JP | 2004-179467 A | 6/2004 |
| KR | 10-2012-0019227 A | 3/2012 |

* cited by examiner

SHIFT REGISTER AND DRIVING METHOD THEREOF, GATE ELECTRODE DRIVING CIRCUIT, AND DISPLAY DEVICE

CROSS-REFERENCE TO RELATED APPLICATION

This application claims priority to Chinese Patent Application No. 201610006922.2 filed on Jan. 5, 2016, the contents of which are incorporated by reference in the entirety.

TECHNICAL FIELD

The present invention relates to the field of display technology, and particularly relates to a shift register and a driving method thereof, a gate electrode driving circuit, and a display device.

BACKGROUND

The fundamental principle of displaying a frame of image by a Thin Film Transistor-Liquid Crystal Display (TFT-LCD) is inputting a square wave having a certain width to gate electrodes of the TFTs in each line of pixels in a line-by-line manner from the top to down so as to turn on each line of pixels in order, and inputting a required signal to source electrodes of the TFTs in each line of pixels in a line-by-line manner from the top to down. At present, in a display device with such structure, the gate electrode driving circuit and the source electrode driving circuit are fabricated on a glass by the Chip On Film (COF) process or the Chip On Glass (COG) process. However, in a case that the display device has a higher resolution, both the gate electrode driving circuit and the source electrode driving circuit have more outputs, and the lengths of the driving circuits may also be increased, which are disadvantageous to the bonding process of the module driving circuit.

In order to overcome the above problem, a design of Gate Drive On Array (GOA) circuit is used in manufacturing the existing display device. Compared with the existing COF or COG processes, GOA is a process having lower cost, contributing to achieve a beautiful design of a symmetrical panel and saving the bonding area for a gate electrode driving circuit and a space for peripheral wiring, thereby achieving a display device with a narrower bezel, and improving productivity and yield of the display device. However, the existing design of the GOA circuit also has some problems. In the existing GOA circuit, each shift register has too many TFTs, and each shift register is used to drive merely one gate line, which causes a larger occupied space. Thus, the space occupied by the GOA circuit is desired to be further reduced so as to achieve a real narrow-bezel design.

SUMMARY

In view of the above problems existed in the shift register of prior art, embodiments of the present invention provide a shift register having a simpler structure and lower power consumption, and a driving method thereof, a gate electrode driving circuit, and a display device.

A first aspect of the invention provides a shift register, comprising an input unit, an output unit, a scan direction selecting unit and a data latching unit, wherein the scan direction selecting unit is connected to a forward-scan signal input terminal, a backward-scan signal input terminal, a positive input terminal, an inverse input terminal and the data latching unit, and is configured to transfer a signal input from the forward-scan signal input terminal or the backward-scan signal input terminal to the data latching unit according to signals input from the positive input terminal and the inverse input terminal, so as to achieve a forward scan or a backward scan;

the input unit is connected to a first clock signal input terminal, the forward-scan signal input terminal, the backward-scan signal input terminal, a low-level signal input terminal and the data latching unit, and is configured to control a signal written into the data latching unit according to a signal input from the first clock signal input terminal and the signal input from one of the forward-scan signal input terminal and the backward-scan signal input terminal;

the data latching unit is connected to a reset signal input terminal, the input unit, the output unit, the scan direction selecting unit, and a high-level signal input terminal, and is configured to latch a signal output by the scan direction selecting unit according to a signal output by the input unit;

the output unit is connected to a second clock signal input terminal, the data latching unit, the low-level signal input terminal, the high-level signal input terminal, the reset signal input terminal, and a signal output terminal, and is configured to output the signal latched by the data latching unit via the signal output terminal according to signals input from the second clock signal input terminal and the reset signal input terminal.

Optionally, the data latching unit comprises a first transistor, a second transistor, a third transistor, a first inverter, a second inverter, a third inverter and a fourth inverter, wherein the first transistor is an N-type transistor, and the second and third transistors are P-type transistors;

a first electrode of the first transistor is connected to the scan direction selecting unit, a second electrode of the first transistor is connected to a first electrode of the second transistor and an input of the second inverter, and a control electrode of the first transistor is connected to an input of the first inverter and the input unit;

the first electrode of the second transistor is connected to the input of the second inverter, a second electrode of the second transistor is connected to an output of the third inverter, and a control electrode of the second transistor is connected to an output of the first inverter;

a first electrode of the third transistor is connected to the high-level signal input terminal, a second electrode of the third transistor is connected to an input of the third inverter and an input of the fourth inverter, and a control of the third transistor is connected to the reset signal input terminal;

an output of the second inverter is connected to the input of the third inverter and the input of the fourth inverter; and an output of the fourth inverter is connected to the output unit.

Optionally, the scan direction selecting unit comprises a first transfer gate and a second transfer gate;

an input of the first transfer gate is connected to the forward-scan signal input terminal, an output of the first transfer gate is connected to the data latching unit and an output of the second transfer gate, a first control end of the first transfer gate is connected to the inverse input terminal, and a second control end of the first transfer gate is connected to the positive input terminal; and an input of the second transfer gate is connected to the backward-scan signal input terminal, the output of the second transfer gate is connected to the data latching unit, a first control end of the second transfer gate is connected to the positive input terminal, and a second control end of the second transfer gate is connected to the inverse input terminal.

Optionally, the input unit comprises a fourth transistor, a fifth inverter, a third transfer gate, and a NOR gate, wherein the fourth transistor is an N-type transistor;

a first electrode of the fourth transistor is connected to the low-level signal input terminal, a second electrode of the fourth transistor is connected to an output of the third transfer gate and the data latching unit, and a control electrode of the fourth transistor is connected to an output of the NOR gate;

an input of the fifth inverter is connected to the output of the NOR gate, and an output of the fifth inverter is connected to a second control end of the third transfer gate;

an input of the third transfer gate is connected to the first clock signal input terminal, a first control end of the third transfer gate is connected to the output of the NOR gate, and the output of the third transfer gate is connected to the data latching unit; and a first input of the NOR gate is connected to the forward-scan signal input terminal, and a second input of the NOR gate is connected to the backward-scan signal input terminal.

Optionally, the output unit comprises a fifth transistor, a sixth transistor, a seventh transistor, a sixth inverter, a seventh inverter, a eighth inverter, and a fourth transfer gate, wherein the fifth transistor is a P-type transistor, and the sixth and seventh transistors are N-type transistor;

a first electrode of the fifth transistor is connected to the high-level signal input terminal, a second electrode of the fifth transistor is connected to a second electrode of the sixth transistor and an input of the seventh inverter, and a control electrode of the fifth transistor is connected to a control electrode of the sixth transistor and the reset signal input terminal;

a first electrode of the sixth transistor is connected to a second electrode of the seventh transistor, the second electrode of the sixth transistor is connected to the input of the seventh inverter, and the control electrode of the sixth transistor is connected to the reset signal input terminal;

a first electrode of the seventh transistor is connected to the low-level signal input terminal, the second electrode of the seventh transistor is connected to the first electrode of the sixth transistor, and a control electrode of the seventh transistor is connected to an output of the sixth inverter and a first control end of the fourth transfer gate;

an input of the sixth inverter is connected to the data latching unit, and the output of the sixth inverter is connected to the first control end of the fourth transfer gate;

the input of the seventh inverter is connected to an output of the fourth transfer gate, an output of the seventh inverter is connected to an input of the eighth inverter, and an output of the eighth inverter is connected to the signal output terminal; and an input of the fourth transfer gate is connected to the second clock signal input terminal, the output of the fourth transfer gate is connected to the input of the seventh inverter, the first control end of the fourth transfer gate is connected to the output of the sixth inverter, and a second control end of the fourth transfer gate is connected to the data latching unit.

A second aspect of the invention provides a driving method of a shift register, comprising:

an initializing stage in which an input unit pulls low an output of a data latching unit according to signals input from a forward-scan signal input terminal, a backward-scan signal input, and a first clock signal input terminal; meanwhile, an output unit pulls low a potential of a signal output terminal according to signals input from a second clock signal input terminal and a reset signal input terminal;

a data latching stage in which the data latching unit latches a signal output by a scan direction selecting unit according to a signal output by the input unit;

an outputting stage in which the output unit outputs the signal latched in the data latching unit according to signals input from the second clock signal input terminal and the reset signal input terminal; and a resetting stage in which the date latching unit and the output unit pull low signals output by themselves according to the signal input from the reset signal input terminal, respectively.

A third aspect of the invention provides a gate electrode driving circuit comprising a plurality of cascaded shift registers, the shift registers each being the shift register as mentioned above.

A fourth aspect of the invention provides a display device comprising the above gate electrode driving circuit.

The present invention has the following benefits.

The shift registers provided by embodiments of the invention comprise an input unit, an output unit, a scan direction selecting unit and a data latching unit, thereby have a simple structure, resulting in lower power consumption and lower production cost. The driving method of the shift register of the embodiments of the invention is simple, thereby has wider applicable range. Due to the shift register of the embodiments of the invention, the gate electrode driving circuit has simpler structure and lower power consumption. Further, the display device of the embodiments of the invention also has simpler structure and lower power consumption, and can be implemented as with a narrower bezel.

DETAILED DESCRIPTION

The present invention will be described in detail below using specific embodiments in conjunction with the accompanying drawings in order that a person skilled in the art can understand the technical solutions of the present invention better.

First Embodiment

The present embodiment provides a shift register including an input unit, an output unit, a scan direction selecting unit and a data latching unit. The shift register of the present embodiment will be described in detail with reference to FIGS. 1 and 2.

Figure 1:
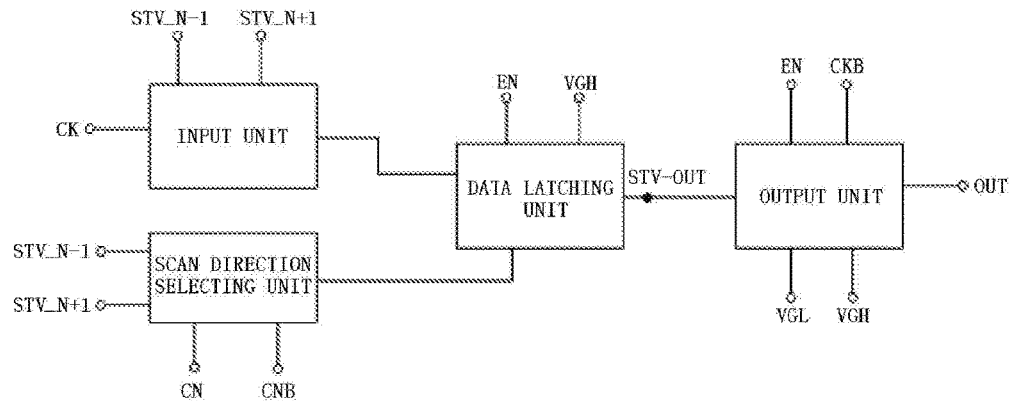
FIG. 1 is a schematic diagram of a structure of a shift register according to a first embodiment of the invention.

As shown in FIG. 1, the scan direction selecting unit is connected to a forward-scan signal input terminal STV_N−1, a backward-scan signal input terminal STV_N+1, a positive input terminal CN, an inverse input terminal CNB, and the data latching unit, and is configured to transfer a signal input from the forward-scan signal input terminal STV_N−1 or a signal input from the backward-scan signal input terminal STV_N+1 to the data latching unit according to signals input from the positive input terminal CN and the inverse input terminal CNB, so as to achieve a forward scan or a backward scan.

Figure 2:
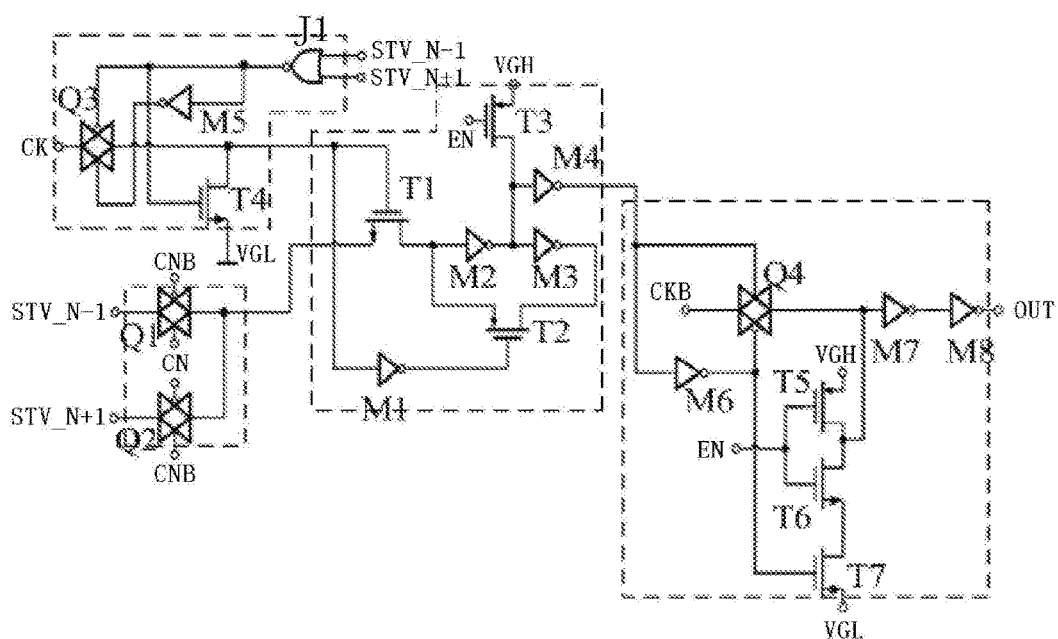
FIG. 2 is a schematic circuit diagram of shift registers according to the first embodiment and a second embodiment of the invention.

Specifically, as shown in FIG. 2, the scan direction selecting unit includes a first transfer gate Q1 and a second transfer gate Q2. An input of the first transfer gate Q1 is connected to the forward-scan signal input terminal STV_N−1, an output of the first transfer gate Q1 is connected to the data latching unit and an output of the second transfer gate Q2, a first control end of the first transfer gate Q1 is connected to the inverse input terminal CNB, and a second control end of the first transfer gate Q1 is connected to the positive input terminal CN. An input of the second transfer gate Q2 is connected to the backward-scan signal input terminal STV_N+1, an output of the second transfer gate Q2 is connected to the data latching unit, a first control end of the second transfer gate Q2 is connected to the positive input terminal CN, and a second control end of the second transfer gate Q2 is connected to the inverse input terminal CNB.

When a high level signal is input from the positive input terminal CN, and a low level signal is input from the inverse input terminal CNB, the first transfer gate Q1 is turned on. In this case, the signal input from the forward-scan signal input terminal STV_N−1 is output to the data latching unit via the scan direction selecting unit so that a forward scan function is achieved.

When a low level signal is input from the positive input terminal CN, and a high level signal is input from the inverse input terminal CNB, the second transfer gate Q2 is turned on. In this case, the signal input from the backward-scan signal input terminal STV_N+1 is output to the data latching unit via the scan direction selecting unit so that a forward scan function is achieved.

The input unit is connected to a first clock signal input terminal CK, the forward-scan signal input terminal STV_N−1, the backward-scan signal input terminal STV_N+1, a low-level signal input terminal VGL and the data latching unit, and is configured to control a signal written into the data latching unit according to a signal input from the first clock signal input terminal CK and the signal input from one of the forward-scan signal input terminal STV_N−1 and the backward-scan signal input terminal STV_N+1.

Specifically, the input unit includes a fourth transistor T4, a fifth inverter M5, a third transfer gate Q3, and a NOR gate J1. The fourth transistor T4 is an N-type transistor. A first electrode of the fourth transistor T4 is connected to the low-level signal input terminal VGL, a second electrode of the fourth transistor T4 is connected to an output of the third transfer gate Q3 and the data latching unit, and a control electrode of the fourth transistor T4 is connected to an output of the NOR gate J1. An input of the fifth inverter M5 is connected to the output of the NOR gate J1, and an output of the fifth inverter M5 is connected to a second control end of the third transfer gate Q3. An input of the third transfer gate Q3 is connected to the first clock signal input terminal CK, a first control end of the third transfer gate Q3 is connected to the output of the NOR gate J1, and the output of the third transfer gate Q3 is connected to the data latching unit. A first input of the NOR gate J1 is connected to the forward-scan signal input terminal STV_N−1, and a second input of the NOR gate is connected to the backward-scan signal input terminal STV_N+1.

Whether in a forward scan or a backward scan process, only one of the forward-scan signal input terminal STV_N−1 and the backward-scan signal input terminal STV_N+1 inputs a high level signal. Thus, the NOR gate J1 outputs a low level signal. In this case, since the fourth transistor T4 is an N-type transistor, it will be turned off. Because the output of the NOR gate J1 is connected to the first control end of the third transfer gate Q3, the low level signal is input to the first control end of the third transfer gate Q3. Meanwhile, the output signal of the NOR gate J1 may also transferred to the second control end of the third transfer gate Q3 via the fifth inverter M5, therefore a high level signal is input to the second control end of the third transfer gate Q3. Consequently, the third transfer gate Q3 is turned on, thereby the signal input from the first clock signal input terminal CK is output via the third transfer gate Q3 to control the data latching unit to be turned on or off.

The data latching unit is connected to a reset signal input terminal EN, the input unit, the output unit, the scan direction selecting unit, and a high-level signal input terminal VGH, and is configured to latch a signal output by the scan direction selecting unit according to a signal output by the input unit.

Specifically, the data latching unit includes a first transistor T1, a second transistor T2, a third transistor T3, a first inverter M1, a second inverter M2, a third inverter M3 and a fourth inverter M4. The first transistor is an N-type transistor, and the second and third transistors T2 and T3 are P-type transistors. A first electrode of the first transistor T1 is connected to the scan direction selecting unit, a second electrode of the first transistor T1 is connected to a first electrode of the second transistor T2 and an input of the second inverter M2, and a control electrode of the first transistor T2 is connected to an input of the first inverter M1 and the input unit. The first electrode of the second transistor T2 is connected to the input of the second inverter M2, a second electrode of the second transistor T2 is connected to an output of the third inverter M3, and a control electrode of the second transistor T2 is connected to an output of the first inverter M1. A first electrode of the third transistor T3 is connected to the high-level signal input terminal VGH, a second electrode of the third transistor T3 is connected to an input of the third inverter M3 and an input of the fourth inverter M4, and a control electrode of the third transistor T3 is connected to the reset signal input terminal EN. An output of the second inverter M2 is connected to the input of the third inverter M3 and the input of the fourth inverter M4. An output STV-OUT of the fourth inverter M4 is connected to the output unit.

When a high level signal is input from the first clock signal input terminal CK, and is output to the data latching unit via the input unit, the first transistor T1 is turned on since it is an N-type transistor. Meanwhile, the signal input from the first clock signal input terminal CK is changed to low level after passing through the first inverter M1. Because the second transistor T2 is a P-type transistor, it is also turned on. Because the first transistor T1 is turned on, the signal output from the scan direction selecting unit which is a high level signal is latched by the data latching unit via the first transistor T1, the second inverter M2 and the fourth inverter M4. The second transistor T2 which is turned on, the second inverter M2 and the third inverter M3 form a closed loop to maintain the output of the second inverter M2 so that a function of latching the signal output by the scan direction selecting unit is achieved.

The output unit is connected to a second clock signal input terminal CKB, the data latching unit, the low-level signal input terminal VGL, the high-level signal input terminal VGH, the reset signal input terminal EN, and a signal output terminal OUT, and is configured to output the signal latched by the data latching unit via the signal output terminal OUT according to signals input from the second clock signal input terminal CKB and the reset signal input terminal EN.

Specifically, the output unit comprises a fifth transistor T5, a sixth transistor T6, a seventh transistor T7, a sixth inverter M6, a seventh inverter M7, a eighth inverter M8, and a fourth transfer gate Q4. The fifth transistor T5 is a P-type transistor, and the sixth and seventh transistors T6, T7 are N-type transistor. A first electrode of the fifth transistor T5 is connected to the high-level signal input terminal VGH, a second electrode of the fifth transistor T5 is connected to a second electrode of the sixth transistor T6 and an input of the seventh inverter M7, and a control electrode of the fifth transistor T5 is connected to a control electrode of the sixth transistor T6 and the reset signal input terminal EN. A first electrode of the sixth transistor T6 is connected to a second electrode of the seventh transistor T7, the second electrode of the sixth transistor T6 is connected to the input of the seventh inverter M7, and the control electrode of the sixth transistor T6 is connected to the reset signal input terminal EN. A first electrode of the seventh transistor T7 is connected to the low-level signal input terminal VGL, the second electrode of the seventh transistor T7 is connected to the first electrode of the sixth transistor T6, and a control electrode of the seventh transistor T7 is connected to an output of the sixth inverter M6 and a first control end of the fourth transfer gate Q4. An input of the sixth inverter M6 is connected to the data latching unit, and the output of the sixth inverter M6 is connected to the first control end of the fourth transfer gate Q4. The input of the seventh inverter M7 is connected to an output of the fourth transfer gate Q4, an output of the seventh inverter M7 is connected to an input of the eighth inverter M8, and an output of the eighth inverter M8 is connected to the signal output terminal OUT. An input of the fourth transfer gate Q4 is connected to the second clock signal input terminal CKB, the output of the fourth transfer gate Q4 is connected to the input of the seventh inverter T7, the first control end of the fourth transfer gate Q4 is connected to the output of the sixth inverter M6, and a second control end of the fourth transfer gate Q4 is connected to the data latching unit.

When the data latching unit outputs the latched high level signal output from the scan direction selecting unit, the high level signal is input to the second control end of the fourth transfer gate Q4, directly, and is input to the first control end of the fourth transfer gate Q4 via the sixth inverter M6, thereby the fourth transfer gate Q4 is turned on. At this time, a high level signal is input from the second clock signal input terminal CKB, and causes the signal output terminal OUT outputs a high level signal after it passes through the seventh inverter M7 and the eighth inverter M8. Meanwhile, the fifth, sixth, and seventh transistors T5, T6, T7 are all turned off, not influencing the output of the signal output terminal OUT.

In sum, the shift register provided by the present embodiment has a simple structure, thereby reducing power consumption and production cost.

Second Embodiment

The present embodiment provides a driving method of a shift register. The method comprises:

an initializing stage: an input unit pulls low an output of a data latching unit according to signals input from a forward-scan signal input terminal STV_N−1, a backward-scan signal input STV_N+1, and a first clock signal input terminal CK; meanwhile, an output unit pulls low a potential of a signal output terminal OUT according to signals input from a second clock signal input terminal CKB and a reset signal input terminal EN;

a data latching stage in which the data latching unit latches a signal output by a scan direction selecting unit according to a signal output by the input unit;

an outputting stage in which the output unit outputs the signal latched in the data latching unit according to signals input from the second clock signal input terminal CKB and the reset signal input terminal EN; and a resetting stage in which the date latching unit and the output unit pull low signals output by themselves according to the signal input from the reset signal input terminal, respectively.

Figure 3:
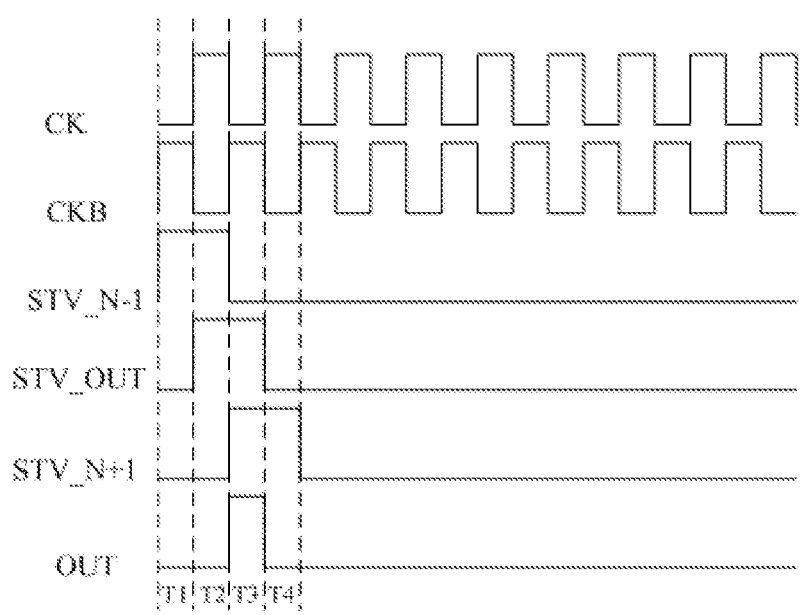
FIG. 3 is a work timing chart of the shift register shown in FIG. 2.

Specifically, referring to the circuit diagram shown in FIG. 2 and the timing chart shown in FIG. 3, descriptions may be made to the driving method of the shift register of the present embodiment. The shift register of the present embodiment may be used to achieve the forward scan function or the backward scan function according to whether a forward-scan signal or a backward-scan signal is input. The forward scan and the backward scan are different only in that their scan subsequences of the gate lines are different. In the forward scan process, scanning is performed from the first gate line to the $N^{th}$ gate line (the last gate line), while in the backward scan process, scanning is performed from the $N^{th}$ gate line to the first gate line. Hereinafter, the driving method of the present embodiment is described by taking the forward scan as an example.

Since the shift register performs the forward scan, the positive input terminal CN inputs a high level signal, and the inverse input terminal CNB inputs a low level signal, thereby the first transfer gate Q1 is turned on.

As shown in FIG. 3, in the initializing stage T1, the forward-scan signal input terminal STV_N−1 inputs a high level signal, the first clock signal input terminal CK inputs a low level signal, and the second clock signal input terminal CKB inputs a high level signal.

Because the forward-scan signal input terminal STV_N−1 inputs a high level signal, the output of the NOR gate J1 outputs a low level signal, which is changed to a high level signal after passing through the fifth inverter M5, thereby the third transfer gate Q3 is turned on. Because the fourth transistor T4 is an N-type transistor, it is turned off at this time. Since the first clock signal input terminal CK inputs the low level signal, the first transistor T1 is turned off, and this low level signal is changed to a high level signal after passing through the first inverter M1, causing the second transistor T2 to be turned off. In this case, the data latching unit outputs a low level signal. Since the output STV-OUT of the fourth inverter M4 outputs the low level signal, which is changed to a high level signal after passing through the sixth inverter M6, the fourth transfer gate Q4 is turned off, and the seventh transistor T7 is turned on. Since the reset signal input terminal EN inputs a high level signal, the fifth transistor T5 is turned off, and the sixth transistor T6 is turned on. Consequently, the low level signal input from the low level signal input terminal VGL passes through the seventh transistor T7, the sixth transistor T6, the seventh inverter M7 and the eighth inverter M8 to pull low the output of the signal output terminal OUT.

In the data latching stage T2, the forward-scan signal input terminal STV_N−1 inputs a high level signal, the first clock signal input terminal CK inputs a high level signal, and the second clock signal input terminal CKB inputs a low level signal.

Since the forward-scan signal input terminal STV_N−1 inputs a high level signal, the output of the NOR gate J1 outputs a low level signal, which is changed to a high level signal after passing through the fifth inverter M5, thereby the third transfer gate Q3 is turned on. Because the fourth transistor T4 is an N-type transistor, it is turned off at this time. Since the first clock signal input terminal CK inputs the high level signal, the first transistor T1 is turned on, and this high level signal is changed to a low level signal after passing through the first inverter M1, causing the second transistor T2 to be turned on. In this case, the high level signal output by the scan direction selecting unit passes through the first transistor T1, the second inverter M2, and the fourth inverter M4 and is output from the output STV-OUT of the data latching unit. Since the second transistor T2 which is turned on, the second inverter M2 and the third inverter M3 form a closed loop to maintain the output of the second inverter M2, the high level signal output by the scan direction selecting unit is latched. Because the second clock signal input terminal CKB inputs a low level signal, which passes through the fourth transfer gate Q4, the seventh inverter M7 and the eighth inverter M8 and then is output from the signal output terminal OUT, the signal output terminal OUT outputs a low level signal.

In the outputting stage T3, the forward-scan signal input terminal STV_N−1 inputs a low level signal, the backward-scan signal input terminal STV_N+1 inputs a high level signal, the first clock signal input terminal CK inputs a low level signal, and the second clock signal input terminal CKB inputs a high level signal.

Since the forward-scan signal input terminal STV_N−1 inputs a low level signal, and the backward-scan signal input terminal STV_N+1 inputs a high level signal, the output of the NOR gate J1 outputs a low level signal, which is changed to a high level signal after passing through the fifth inverter M5, thereby the third transfer gate Q3 is turned on. Because the fourth transistor T4 is an N-type transistor, it is turned off. Since the first clock signal input terminal CK inputs a low level signal, the first transistor T1 is turned off, and this low level signal is changed to a high level signal after passing through the first inverter M1, causing the second transistor T2 to be turned off. In this case, the output signal at the output STV-OUT of the fourth inverter M4 is remained as the output signal in the previous stage T2, i.e., the output signal is a high level signal. The high level signal output from the output STV-OUT is changed to a low level signal after passing through the sixth inverter M6, causing the fourth transfer gate Q4 to be turned on. Since the second clock signal input terminal CKB inputs a high level signal, this high level signal passes through the fourth transfer gate Q4, the seventh inverter M7 and the eighth inverter M8 and is output from the signal output terminal OUT, thereby the signal output terminal OUT outputs a high level signal.

In the resetting stage T4, the forward-scan signal input terminal STV_N−1 inputs a low level signal, the backward-scan signal input terminal STV_N+1 inputs a high level signal, the first clock signal input terminal CK inputs a high level signal, and the second clock signal input terminal CKB inputs a low level signal.

Since the forward-scan signal input terminal STV_N−1 inputs a low level signal, and the backward-scan signal input terminal STV_N+1 inputs a high level signal, the output of the NOR gate J1 outputs a low level signal, which is changed to a high level signal after passing through the fifth inverter M5, thereby the third transfer gate Q3 is turned on. Because the fourth transistor T4 is an N-type transistor, it is turned off at this time. Since the first clock signal input terminal CK inputs a high level signal, the first transistor T1 is turned on; meanwhile, this high level signal is changed to a low level signal after passing through the first inverter M1, thus the second transistor T2 is turned on. In this case, the data latching unit outputs a low level signal. Because the fourth inverter M4 outputs the low level signal, which is then changed to a high level signal after the sixth inverter M6, the fourth transfer gate Q4 is turned off and the seventh transistor T7 is turned on. The reset signal input terminal EN inputs a high level signal, thus the fifth transistor T5 is turned off, and the sixth transistor T6 is turned on. Consequently, after passing through the seventh transistor T7, the sixth transistor T6, the seventh inverter M7 and the eighth inverter M8, the low level signal input from the low level signal input terminal VGL pulls low the output signal at the signal output terminal OUT.

In the driving method of the present embodiment, by controlling on/off of the third transfer gate Q3 using NOR logic operation with the signals from the forward-scan signal input terminal STV_N−1 and the backward-scan signal input terminal STV_N+1, the signal input from the first clock signal input terminal CK has only two pulses within the scanning time period for each line, reducing the on/off frequency of each transistor and thereby reducing power consumption. In the data latching unit, by using inverters and a transistor (the second transistor T2, the second inverter M2 and the third inverter M3) which have simple structure to constitute a loop, a simple and effective circuit is achieved and undesired output error may be reduced. Meanwhile, power consumption is lowered due to reduced number of the transistors. In the output unit, a pulse input from the second clock signal input terminal CKB is output as the output signal at the signal output terminal OUT, by controlling the fourth transfer gate Q4 using the signal output from the output of the fourth inverter M4 of the data latching unit. During normal work (in the above-mentioned periods T1-T4), the reset signal input terminal EN inputs a high level signal. On the other hand, in the state of rapid discharging of full panel, the reset signal input terminal EN inputs a low level signal so as to lock the shift register; meanwhile, the signal output terminal OUT is set to high level, and the transistors in the pixel circuit in the pixel area are turned on so as to rapidly discharge the charges stored in the storage capacitors in the pixel circuit.

Third Embodiment

The present embodiment provides a gate electrode driving circuit which includes a plurality of cascaded shift registers, each of which is the shift register in the first embodiment. The forward-scan signal input terminal STV_N−1 of each shift register may be connected to the output of a shift register in the previous stage, and the backward-scan signal input terminal STV_N+1 of each shift register may be connected to the output of a shift register in the next stage. The details of the shift register may be found from the description of the first embodiment.

Accordingly, the present embodiment also provides a display device including the gate electrode driving circuit. Also, the description of the shift register in the gate electrode driving circuit in the display device may be found from the description of the first embodiment, and is omitted here.

It could be understood that the above implements are merely exemplary embodiments adopted for describing the principle of the present invention, but the present invention is not limited thereto. Various variations and improvements may be made by those of ordinary skill in the art without departing from the spirit and essence of the present invention, and these variations and improvements shall also fall into the protection scope of the present invention.

The invention claimed is:

1. A shift register, comprising an input unit, an output unit, a scan direction selecting unit and a data latching unit, wherein
the scan direction selecting unit is connected to a forward-scan signal input terminal, a backward-scan signal input terminal, a positive input terminal, an inverse input terminal and the data latching unit, and is configured to transfer a signal input from the forward-scan signal input terminal or the backward-scan signal input terminal to the data latching unit according to signals input from the positive input terminal and the inverse input terminal, so as to achieve a forward scan or a backward scan;
the input unit is connected to a first clock signal input terminal, the forward-scan signal input terminal, the backward-scan signal input terminal, a low-level signal input terminal and the data latching unit, and is configured to control a signal written into the data latching unit according to a signal input from the first clock signal input terminal and the signal input from one of the forward-scan signal input terminal and the backward-scan signal input terminal;
the data latching unit is connected to a reset signal input terminal, the input unit, the output unit, the scan direction selecting unit, and a high-level signal input terminal, and is configured to latch a signal output by the scan direction selecting unit according to a signal output by the input unit,
wherein the data latching unit comprises a first transistor, a second transistor, a third transistor, a first inverter, a second inverter, a third inverter and a fourth inverter, wherein the first transistor is an N-type transistor, and the second and third transistors are P-type transistors,
a first electrode of the first transistor is connected to the scan direction selecting unit, a second electrode of the first transistor is connected to a first electrode of the second transistor and an input of the second inverter, and a control electrode of the first transistor is connected to an input of the first inverter and the input unit,
the first electrode of the second transistor is connected to the input of the second inverter, a second electrode of the second transistor is connected to an output of the third inverter, and a control electrode of the second transistor is connected to an output of the first inverter,
a first electrode of the third transistor is connected to the high-level signal input terminal, a second electrode of the third transistor is connected to an input of the third inverter and an input of the fourth inverter, and a control electrode of the third transistor is connected to the reset signal input terminal,
an output of the second inverter is connected to the input of the third inverter and the input of the fourth inverter, and
an output of the fourth inverter is connected to the output unit,
wherein the output unit is connected to a second clock signal input terminal, the data latching unit, the low-level signal input terminal, the high-level signal input terminal, the reset signal input terminal, and a signal output terminal, and is configured to output the signal latched by the data latching unit via the signal output terminal according to signals input from the second clock signal input terminal and the reset signal input terminal.

2. The shift register of claim 1, wherein
the scan direction selecting unit comprises a first transfer gate and a second transfer gate;
an input of the first transfer gate is connected to the forward-scan signal input terminal, an output of the first transfer gate is connected to the data latching unit and an output of the second transfer gate, a first control end of the first transfer gate is connected to the inverse input terminal, and a second control end of the first transfer gate is connected to the positive input terminal; and
an input of the second transfer gate is connected to the backward-scan signal input terminal, the output of the second transfer gate is connected to the data latching unit, a first control end of the second transfer gate is connected to the positive input terminal, and a second control end of the second transfer gate is connected to the inverse input terminal.

3. The shift register of claim 1, wherein
the input unit comprises a fourth transistor, a fifth inverter, a third transfer gate, and a NOR gate, wherein the fourth transistor is an N-type transistor;
a first electrode of the fourth transistor is connected to the low-level signal input terminal, a second electrode of the fourth transistor is connected to an output of the third transfer gate and the data latching unit, and a control electrode of the fourth transistor is connected to an output of the NOR gate;
an input of the fifth inverter is connected to the output of the NOR gate, and an output of the fifth inverter is connected to a second control end of the third transfer gate;
an input of the third transfer gate is connected to the first clock signal input terminal, a first control end of the third transfer gate is connected to the output of the NOR gate, and the output of the third transfer gate is connected to the data latching unit; and
a first input of the NOR gate is connected to the forward-scan signal input terminal, and a second input of the NOR gate is connected to the backward-scan signal input terminal.

4. The shift register of claim 1, wherein
the output unit comprises a fifth transistor, a sixth transistor, a seventh transistor, a sixth inverter, a seventh inverter, a eighth inverter, and a fourth transfer gate, wherein the fifth transistor is a P-type transistor, and the sixth and seventh transistors are N-type transistor;
a first electrode of the fifth transistor is connected to the high-level signal input terminal, a second electrode of the fifth transistor is connected to a second electrode of the sixth transistor and an input of the seventh inverter, and a control electrode of the fifth transistor is connected to a control electrode of the sixth transistor and the reset signal input terminal;
a first electrode of the sixth transistor is connected to a second electrode of the seventh transistor, the second electrode of the sixth transistor is connected to the input of the seventh inverter, and the control electrode of the sixth transistor is connected to the reset signal input terminal;
a first electrode of the seventh transistor is connected to the low-level signal input terminal, the second electrode of the seventh transistor is connected to the first electrode of the sixth transistor, and a control electrode of the seventh transistor is connected to an output of the sixth inverter and a first control end of the fourth transfer gate;

an input of the sixth inverter is connected to the data latching unit, and the output of the sixth inverter is connected to the first control end of the fourth transfer gate;

the input of the seventh inverter is connected to an output of the fourth transfer gate, an output of the seventh inverter is connected to an input of the eighth inverter, and an output of the eighth inverter is connected to the signal output terminal; and an input of the fourth transfer gate is connected to the second clock signal input terminal, the output of the fourth transfer gate is connected to the input of the seventh inverter, the first control end of the fourth transfer gate is connected to the output of the sixth inverter, and a second control end of the fourth transfer gate is connected to the data latching unit.

5. A gate electrode driving circuit comprising a plurality of cascaded shift registers, the shift registers each being the shift register of claim 1.

6. The gate electrode driving circuit of claim 5, wherein the scan direction selecting unit comprises a first transfer gate and a second transfer gate;

an input of the first transfer gate is connected to the forward-scan signal input terminal, an output of the first transfer gate is connected to the data latching unit and an output of the second transfer gate, a first control end of the first transfer gate is connected to the inverse input terminal, and a second control end of the first transfer gate is connected to the positive input terminal; and an input of the second transfer gate is connected to the backward-scan signal input terminal, the output of the second transfer gate is connected to the data latching unit, a first control end of the second transfer gate is connected to the positive input terminal, and a second control end of the second transfer gate is connected to the inverse input terminal.

7. The gate electrode driving circuit of claim 5, wherein the input unit comprises a fourth transistor, a fifth inverter, a third transfer gate, and a NOR gate, wherein the fourth transistor is an N-type transistor;

a first electrode of the fourth transistor is connected to the low-level signal input terminal, a second electrode of the fourth transistor is connected to an output of the third transfer gate and the data latching unit, and a control electrode of the fourth transistor is connected to an output of the NOR gate;

an input of the fifth inverter is connected to the output of the NOR gate, and an output of the fifth inverter is connected to a second control end of the third transfer gate;

an input of the third transfer gate is connected to the first clock signal input terminal, a first control electrode of the third transfer gate is connected to the output of the NOR gate, and the output of the third transfer gate is connected to the data latching unit; and a first input of the NOR gate is connected to the forward-scan signal input terminal, and a second input of the NOR gate is connected to the backward-scan signal input terminal.

8. The gate electrode driving circuit of claim 5, wherein the output unit comprises a fifth transistor, a sixth transistor, a seventh transistor, a sixth inverter, a seventh inverter, a eighth inverter, and a fourth transfer gate, wherein the fifth transistor is a P-type transistor, and the sixth and seventh transistors are N-type transistor;

a first electrode of the fifth transistor is connected to the high-level signal input terminal, a second electrode of the fifth transistor is connected to a second electrode of the sixth transistor and an input of the seventh inverter, and a control electrode of the fifth transistor is connected to a control electrode of the sixth transistor and the reset signal input terminal;

a first electrode of the sixth transistor is connected to a second electrode of the seventh transistor, the second electrode of the sixth transistor is connected to the input of the seventh inverter, and the control electrode of the sixth transistor is connected to the reset signal input terminal;

a first electrode of the seventh transistor is connected to the low-level signal input terminal, the second electrode of the seventh transistor is connected to the first electrode of the sixth transistor, and a control electrode of the seventh transistor is connected to an output of the sixth inverter and a first control end of the fourth transfer gate;

an input of the sixth inverter is connected to the data latching unit, and the output of the sixth inverter is connected to the first control end of the fourth transfer gate;

the input of the seventh inverter is connected to an output of the fourth transfer gate, an output of the seventh inverter is connected to an input of the eighth inverter, and an output of the eighth inverter is connected to the signal output terminal; and an input of the fourth transfer gate is connected to the second clock signal input terminal, the output of the fourth transfer gate is connected to the input of the seventh inverter, the first control end of the fourth transfer gate is connected to the output of the sixth inverter, and a second control end of the fourth transfer gate is connected to the data latching unit.

9. A display device comprising a gate electrode driving circuit which comprises a plurality of cascaded shift registers, the shift registers each being the shift register of claim 1.

10. The display device of claim 9, wherein
the scan direction selecting unit comprises a first transfer gate and a second transfer gate;

an input of the first transfer gate is connected to the forward-scan signal input terminal, an output of the first transfer gate is connected to the data latching unit and an output of the second transfer gate, a first control end of the first transfer gate is connected to the inverse input terminal, and a second control end of the first transfer gate is connected to the positive input terminal; and an input of the second transfer gate is connected to the backward-scan signal input terminal, the output of the second transfer gate is connected to the data latching unit, a first control end of the second transfer gate is connected to the positive input terminal, and a second control end of the second transfer gate is connected to the inverse input terminal.

11. The display device of claim 9, wherein
the input unit comprises a fourth transistor, a fifth inverter, a third transfer gate, and a NOR gate, wherein the fourth transistor is an N-type transistor;

a first electrode of the fourth transistor is connected to the low-level signal input terminal, a second electrode of the fourth transistor is connected to an output of the third transfer gate and the data latching unit, and a control electrode of the fourth transistor is connected to an output of the NOR gate;

an input of the fifth inverter is connected to the output of the NOR gate, and an output of the fifth inverter is connected to a second control end of the third transfer gate;

an input of the third transfer gate is connected to the first clock signal input terminal, a first control end of the third transfer gate is connected to the output of the NOR gate, and the output of the third transfer gate is connected to the data latching unit; and a first input of the NOR gate is connected to the forward-scan signal input terminal, and a second input of the NOR gate is connected to the backward-scan signal input terminal.

12. The display device of claim 9, wherein the output unit comprises a fifth transistor, a sixth transistor, a seventh transistor, a sixth inverter, a seventh inverter, a eighth inverter, and a fourth transfer gate, wherein the fifth transistor is a P-type transistor, and the sixth and seventh transistors are N-type transistor;

a first electrode of the fifth transistor is connected to the high-level signal input terminal, a second electrode of the fifth transistor is connected to a second electrode of the sixth transistor and an input of the seventh inverter, and a control electrode of the fifth transistor is connected to a control electrode of the sixth transistor and the reset signal input terminal;

a first electrode of the sixth transistor is connected to a second electrode of the seventh transistor, the second electrode of the sixth transistor is connected to the input of the seventh inverter, and the control electrode of the sixth transistor is connected to the reset signal input terminal;

a first electrode of the seventh transistor is connected to the low-level signal input terminal, the second electrode of the seventh transistor is connected to the first electrode of the sixth transistor, and a control electrode of the seventh transistor is connected to an output of the sixth inverter and a first control end of the fourth transfer gate;

an input of the sixth inverter is connected to the data latching unit, and the output of the sixth inverter is connected to the first control end of the fourth transfer gate;

the input of the seventh inverter is connected to an output of the fourth transfer gate, an output of the seventh inverter is connected to an input of the eighth inverter, and an output of the eighth inverter is connected to the signal output terminal; and an input of the fourth transfer gate is connected to the second clock signal input terminal, the output of the fourth transfer gate is connected to the input of the seventh inverter, the first control end of the fourth transfer gate is connected to the output of the sixth inverter, and a second control end of the fourth transfer gate is connected to the data latching unit.

13. A driving method of a shift register, the driving method comprising:

an initializing stage in which an input unit pulls low an output of a data latching unit according to signals input from a forward-scan signal input terminal, a backward-scan signal input, and a first clock signal input terminal; meanwhile, an output unit pulls low a potential of a signal output terminal according to signals input from a second clock signal input terminal and a reset signal input terminal;

a data latching stage in which the data latching unit latches a signal output by a scan direction selecting unit according to a signal output by the input unit;

wherein the data latching unit comprises a first transistor, a second transistor, a third transistor, a first inverter, a second inverter, a third inverter and a fourth inverter, wherein the first transistor is an N-type transistor, and the second and third transistors are P-type transistors, a first electrode of the first transistor is connected to the scan direction selecting unit, a second electrode of the first transistor is connected to a first electrode of the second transistor and an input of the second inverter, and a control electrode of the first transistor is connected to an input of the first inverter and the input unit, the first electrode of the second transistor is connected to the input of the second inverter, a second electrode of the second transistor is connected to an output of third inverter, and a control electrode of the second transistor is connected to an output of the first inverter, a first electrode of the third transistor is connected to the high-level signal input terminal, a second electrode of the third transistor is connected to an input of the third inverter and an input of the fourth inverter, and a control electrode of the third transistor is connected to the reset signal input terminal, an output of the second inverter is connected to the input of the third inverter and the input of the fourth inverter, and an output of the fourth inverter is connected to the output unit, wherein when the first transistor is turned on, the signal output from the scan direction selecting unit is latched by the data latching unit via the first transistor, the second inverter and the fourth inverter, and when the second transistor is turned on, the second inverter and the third inverter from a closed loop to maintain the output of the second inverter so that a function of latching the signal output by the scan direction selecting unit is achieved;

an outputting stage in which the output unit outputs the signal latched in the data latching unit according to signals input from the second clock signal input terminal and the reset signal input terminal; and a resetting stage in which the date latching unit and the output unit pull low signals output by themselves according to the signal input from the reset signal input terminal, respectively.

* * * * *